(12) United States Patent
Gilliland

(10) Patent No.: US 6,888,064 B2
(45) Date of Patent: May 3, 2005

(54) MODULAR PACKAGING ARRANGEMENTS AND METHODS

(75) Inventor: Don Alan Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/324,797

(22) Filed: Dec. 18, 2002

(65) Prior Publication Data

US 2004/0118587 A1 Jun. 24, 2004

(51) Int. Cl.$^7$ ................................................ H05K 1/00
(52) U.S. Cl. ...................... 174/52.4; 361/760; 361/807
(58) Field of Search ........................ 174/52.4; 361/760, 361/766, 772, 773, 774, 786, 807, 813; 257/666, 677, 676

(56) References Cited

U.S. PATENT DOCUMENTS

| | | | |
|---|---|---|---|
| 4,562,092 A | | 12/1985 | Wiech, Jr. |
| 4,912,401 A | | 3/1990 | Nady, II et al. |
| 5,460,531 A | | 10/1995 | Vivio |
| 5,543,584 A | | 8/1996 | Handford et al. |
| 5,557,504 A | * | 9/1996 | Siegel et al. ............... 361/773 |
| 5,909,010 A | | 6/1999 | Inoue |
| 5,994,774 A | * | 11/1999 | Siegel et al. ............... 257/727 |
| 6,004,867 A | | 12/1999 | Kim et al. |
| 6,303,954 B1 | | 10/2001 | Ohoka |
| 6,354,859 B1 | * | 3/2002 | Barabi et al. ............... 439/331 |
| 6,614,121 B1 | * | 9/2003 | Heenan ...................... 257/777 |
| 2001/0035529 A1 | | 11/2001 | Bertin et al. |
| 2002/0164893 A1 | | 11/2002 | Mathieu et al. |

OTHER PUBLICATIONS

IBM Technical Disclosure Bulletin, vol. 33, No. 6B, Nov. 1990, pp. 473–474 "Non–Permanent Mounting Technique for Test and Burn–In of C4 Devices".

Electronic Design, Dec. 7, 1999, vol. 47, No. 26, Advanced IC Packages, pp. 1–6 "Advanced IC Packages Keep Silicon and Systems Flying" by David Morrison.

url: http://216.239.51.100/search?q=cac.../298113.htm+chip+scale+packaging&hl=en&ie=UTF-8 "Chip Scale Packaging (CSP) for Intel Flash Memory Devices—Product Overview".

* cited by examiner

Primary Examiner—Dean A. Reichard
Assistant Examiner—Carmelo Oliva
(74) Attorney, Agent, or Firm—Leslie J. Payne

(57) ABSTRACT

The present invention relates generally to chip packaging and methods of packaging and, more particularly, to compact packaging of chips and methods thereof in electronic environments that minimize undesired electronic effects, promote speed, and enhance packaging versatility.

7 Claims, 7 Drawing Sheets

MODULAR PACKAGING ARRANGEMENTS AND METHODS

BACKGROUND OF THE INVENTION

The present invention relates generally to chip packaging and methods of packaging and, more particularly, to compact packaging of chips and methods thereof in electronic environments that minimize undesired electronic effects, promote speed, and enhance packaging versatility.

Packaging and operational concerns of computer chip systems are becoming problematic given their higher operating speeds, higher power requirements as well as the ever increasing demands for their miniaturization and the additional system functionalities being added. Consequently, electromagnetic interference (EMI) and signal integrity (SI) concerns associated with the foregoing issues are similarly difficult to address. Moreover, further EMI and SI concerns arise given that the electronic devices in which such chip systems are used are also being driven by board level compactness considerations. Accordingly, achieving higher speeds, electromagnetic compatibility (EMC) and SI, for such chips and electronic devices are of critical importance from commercial considerations.

In many situations, chip modules or packages are mounted on a printed circuit board and connected by lead frames to a variety of devices including passive devices of the kind typically associated with such chip modules. EMI is a problem because of, for example, the inductance generally associated with the relatively large area encompassed by long lead frames extending between the chip module and the surrounding passive devices on the printed circuit board. Moreover, the printed circuit board space or real estate is consumed because these passive devices generally surround and are spaced from the chip module's periphery thereby hindering miniaturization.

A known approach for addressing this situation is the use of chip-scale packaging technology wherein electronic components are permanently stacked on a chip and permanently retained within a module housing. While this approach has many advantages, it does not allow for customizing and modifying the components that are permanently attached to the chip. Accordingly, known chip packaging technologies and chip-scale packaging approaches are less versatile in that they do not enable opportunities for customizing and changing components associated with a chip. Moreover, these chip-scale packaging approaches do not allow external testing and power supply connectors to be electrically coupled to the chip modules.

Without the ability to provide semiconductor devices with enhanced power and speed functionalities especially in a compact environment so as to minimize EMI and enhance SI, the true potential of these devices is less than otherwise attainable. Furthermore, without the ability to allow the customization or modification of such semiconductor devices in the field, their true potential is diminished.

SUMMARY OF THE INVENTION

The present invention is directed to packaging arrangements and methods that address the above-mentioned concerns.

According to the present invention, provision is made for a method and packaging arrangement of coupling at least one functional component to an electronic module. Included are the steps of: providing an electronic module including a semiconductor assembly; providing one functional component; and, releasably coupling the functional component to a housing assembly of the electronic module and electrically to the semiconductor assembly so as to be in juxtaposed relationship to the semiconductor assembly.

In another preferred embodiment, provision is made for a method and packaging arrangement noted above in which a plurality of functional components is directly coupled to a housing assembly of the module.

In another preferred embodiment, provision is made for a method and packaging arrangement noted above and further comprising releasably mechanically and electrically coupling at least a second functional component to the module.

In another preferred embodiment, provision is made for a method and packaging arrangement noted above wherein the coupling is accomplished by providing a releasable mechanical coupling of the one functional component for allowing modification of the module.

In another preferred embodiment, provision is made for a method and packaging arrangement noted above wherein the releasable mechanical coupling is accomplished by providing a quick-disconnect mechanical coupling.

In another preferred embodiment, provision is made for a method and packaging arrangement noted above wherein the quick-disconnect mechanical coupling is accomplished by providing one or more edge connectors on at least one of the one functional component and the housing assembly.

In another preferred embodiment, provision is made for a method and packaging arrangement noted above wherein the coupling is accomplished by providing electrical connectors on the chip module for mating with complementary structure on the one functional component.

In another preferred embodiment, provision is made for a method and packaging arrangement noted above wherein the releasably mechanical coupling includes inserting the functional component in a recess of the module.

In another preferred embodiment, provision is made for a method and packaging arrangement noted above wherein the one functional component is in overlying juxtaposed relationship to the semiconductor assembly of the module.

In another preferred embodiment, provision is made for a method and packaging arrangement noted above wherein the one functional component is selected from a group consisting of at least one active functional component, passive component, semiconductor chip, a semiconductor memory device, or other device couplable and operable with a module.

In another preferred embodiment, provision is made for a method and packaging arrangement noted above wherein providing one functional component is accomplished by providing a connector for providing testing or power supply.

In another preferred embodiment, provision is made for a method and packaging arrangement noted above wherein providing one functional component is accomplished by providing a RF unit, such as an antenna, bus or the like.

It is, therefore, a principal aspect of this invention to provide for significant improvements in the reduction of board space for packaging semiconductor assemblies that address the above-mentioned concerns.

It is an exemplary aspect of the present invention to provide for significant improvements in lessening impedance to external functional components for packaging semiconductor assemblies that address the above-mentioned concerns.

It is still another aspect of the present invention for providing a method and package for facilitating extremely high speeds between the functional components and the semiconductor chip without significant disadvantages of EMI, while providing advantages for SI and other functions.

Yet another aspect of the present invention is the significant improvement in system versatility in allowing releasable connections of the functional components.

Still another aspect of the present invention is the use of mechanical coupling arrangements, such as, quick connects and disconnects.

A further aspect of the present invention is for maximizing board space savings in addition to the other aspects.

A still further aspect of the present invention is provision for a compact product packaging that allows the formation of a wide variety of product offerings.

It is yet another aspect of the present invention for providing a method and package for applications that are board size-sensitive, such as cellular phones, digital cameras, and computer systems.

DETAILED DESCRIPTION

Figure 1:
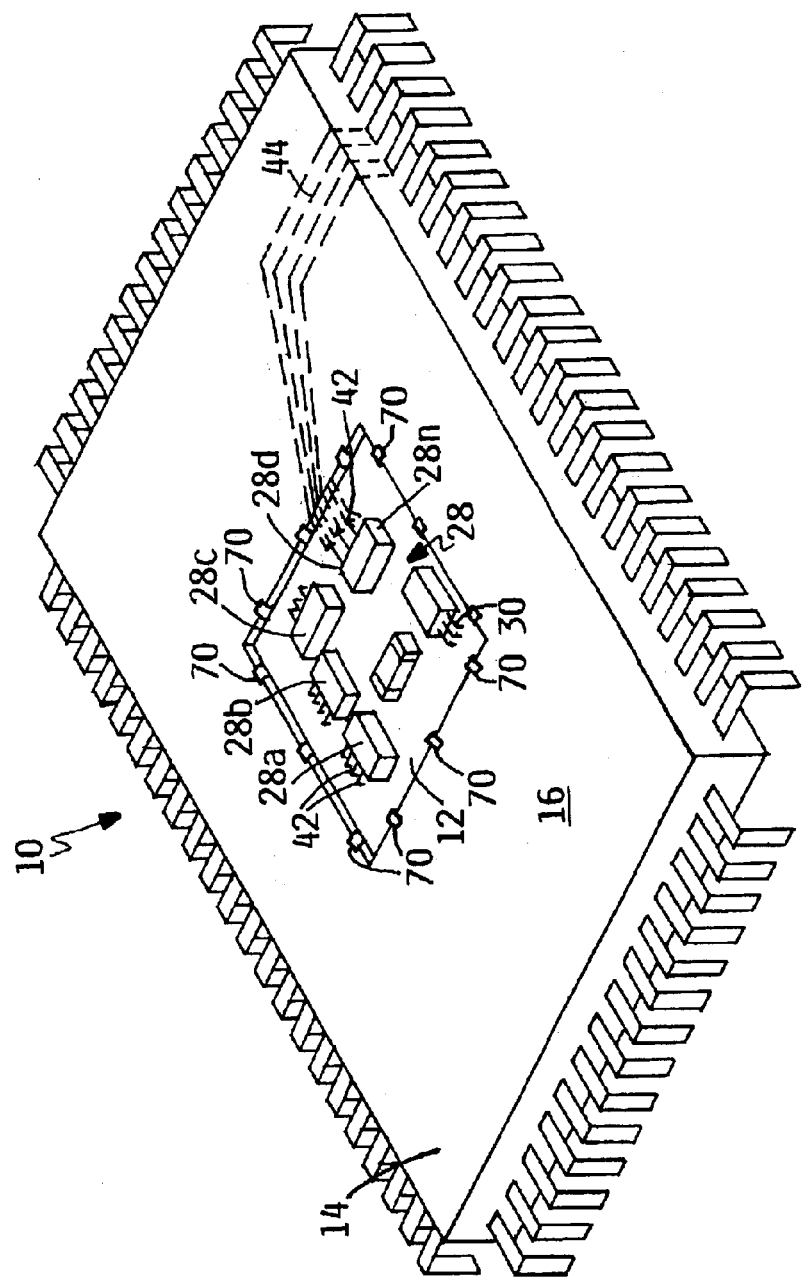
FIG. 1 is a perspective view of one preferred embodiment of a chip assembly of the present invention.
Figure 2:
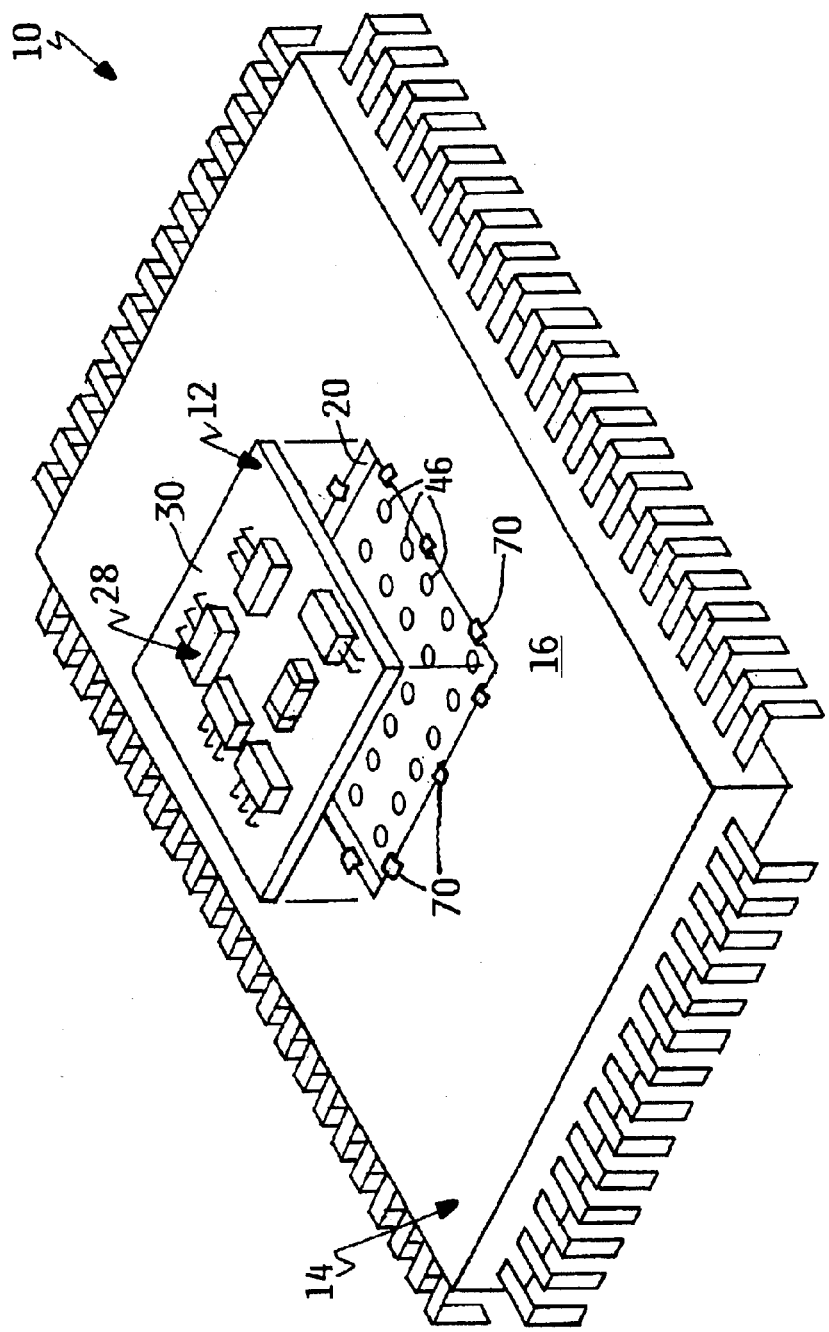
FIG. 2 is an exploded perspective view similar to FIG. 1.

Reference is made to FIGS. 1–8 for illustrating several preferred embodiments of the present invention directed to a packaging apparatus or arrangement designated generally by reference numeral 10. In this embodiment, the packaging apparatus 10 includes a functional component assembly 12 releasably coupled to an electronic chip package or module 14 in a manner to be described.

In an exemplary preferred embodiment illustrated in FIG. 1, the functional component assembly 12 is insertable within a complementary shaped recess or socket 20 formed in a top surface 16 of a housing assembly 24 of the chip module 14. The functional component assembly 12 is positively and releasably retained by a mechanical releasable coupling assembly 26 that acts to releasably couple the functional component assembly to the housing assembly for allowing a user to customize or modify the chip module in the field. The functional component assembly need not be fitted completely in the socket 20 and may extend at, above or below the top surface 16. One example of the functional component assembly 12 includes one or more electrical and/or electronic functional components 28a, 28b, 28c, 28d, 28n (collectively 28) secured on one surface of a printed circuit functional component board 30 in any known manner. In regard to the functional components 28, they can be any suitable type and as envisioned are selected from a group consisting at least one active functional component, passive functional component, solid-state semiconductor assemblies including semiconductor chips and memory devices, a connector, a bus or the like. Various mounting schemes well known in the art and those yet to be developed can be used. It will be appreciated that the foregoing components can be releasably coupled to the housing assembly and, therefore, provides significant advantages as will be described for many applications. In the exemplary embodiment, they can be of the passive type and include, but are not limited to resistors, capacitors, decoupling capacitors, inductors and the like. If active types of components are selected they can be, for instance, a RF unit comprising an antenna (including PEC, PMC types), bus or the like for use in communication systems. Examples of other active components include but are not limited to active solid-state electronic devices that may or may not include other circuits. Active devices, such as chips, diodes, FET's, transistors, and, displays, such as LED's, LCD's, and OLED's are envisioned. In the embodiment including the displays, such displays can provide a variety of information including failure indicators. The component board 30 in the exemplary embodiment can be a relatively thin and planar FR4 type board having a configuration which in this embodiment is rectangular or square and generally matches the configuration of the socket in the housing assembly for providing a relatively close fit for facilitating a releasable and positive retention; as will be described. Clearly, a wide variety of different shapes and sizes can be used for the component board 30 as well as for the socket. While the component board 30 is described to be within the socket, such need not be the case. Of course, a wide variety of boards and board materials can be used.

Figure 7:
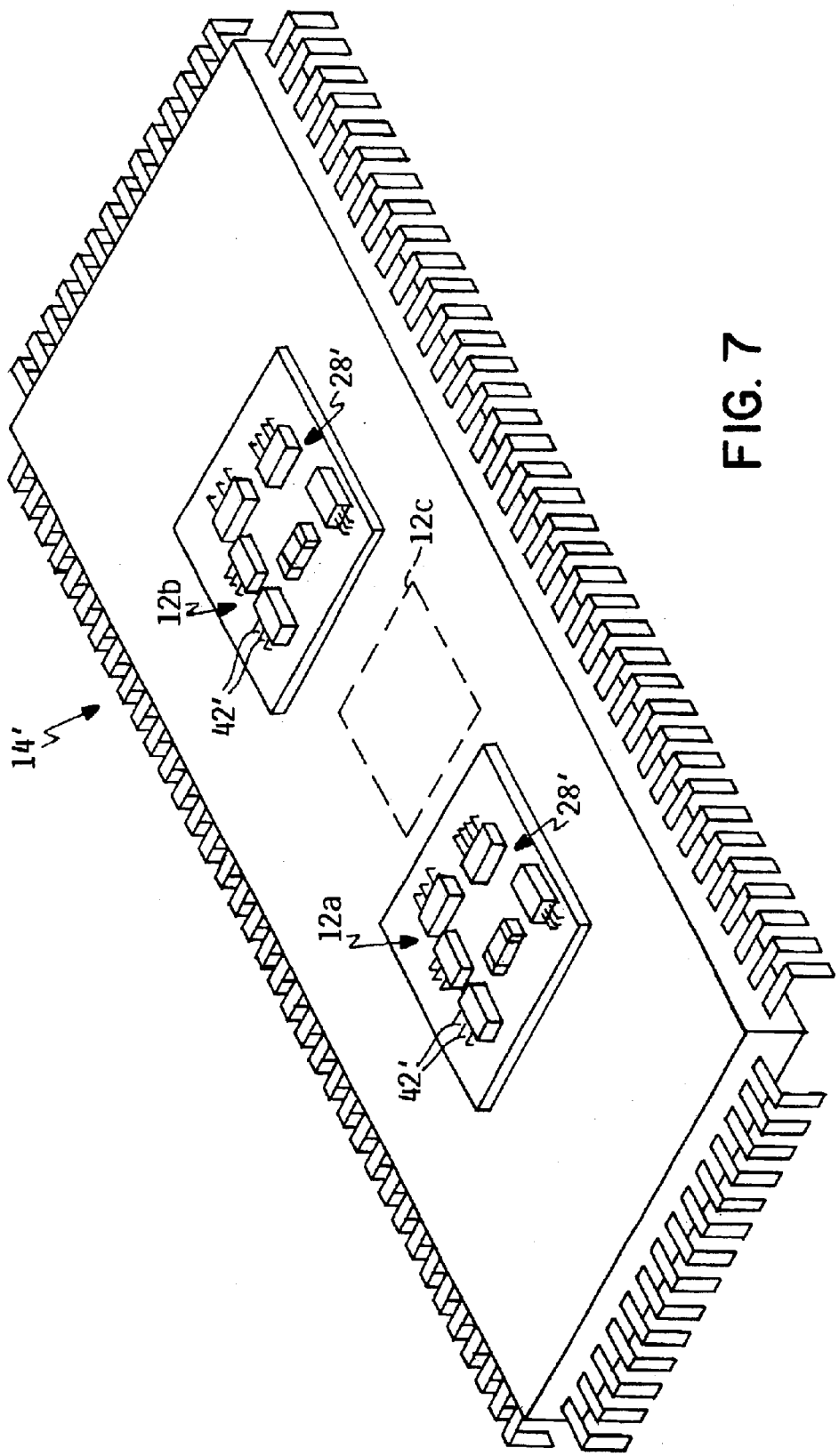
FIG. 7 is a perspective view of yet another preferred embodiment of the present invention illustrating a module including multiple inserts.

FIG. 7 illustrates that more than one functional component assembly 12a–12c is intended to be releasably coupled to an electronic chip package or module 14'. Although the functional component assemblies 12a and 12b are illustrated as mounted on a single module surface of the chip module 14', it will be appreciated that this invention envisions that one or more of the functional component assemblies 12c can be releasably coupled to other surfaces (e.g., a bottom surface) of the chip module. In this embodiment, the components and conductors are indicated by the same reference numerals, but with the addition of prime markings.

Figure 3:
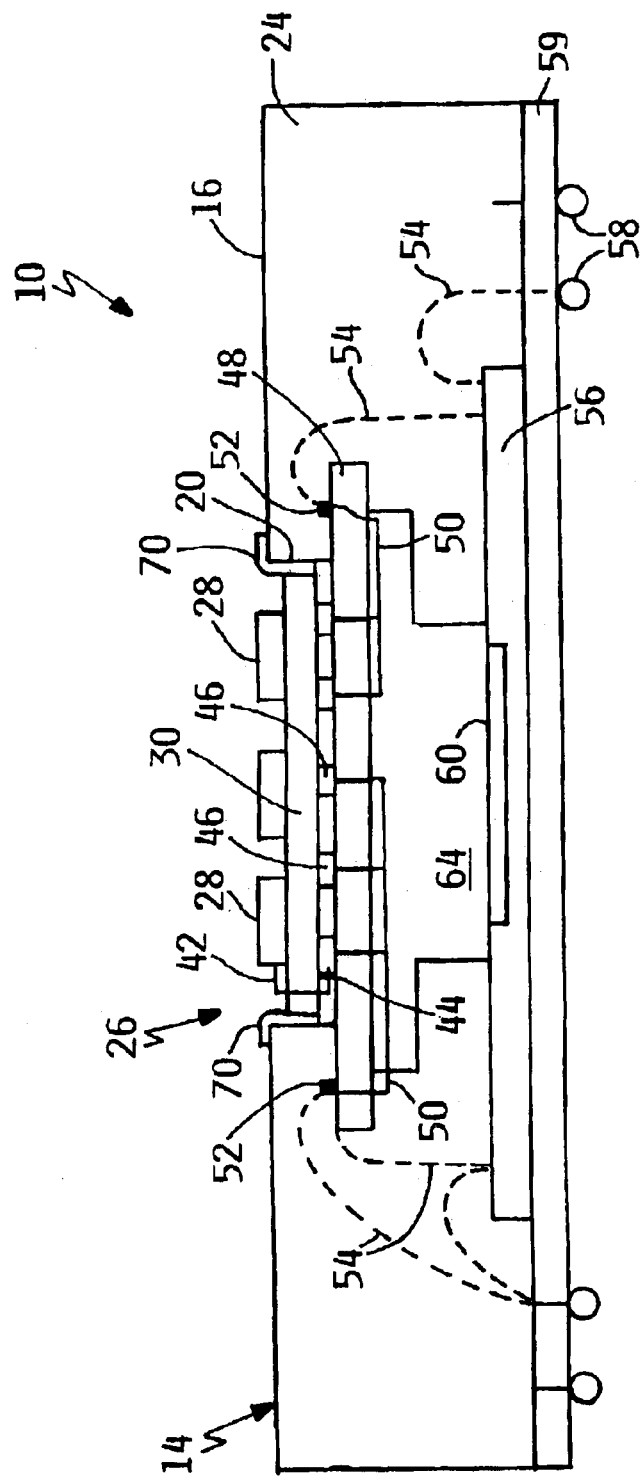
FIG. 3 is a diagrammatic cross-sectional view of a chip assembly according to the chip assembly depicted in FIGS. 1 and 2.
Figure 4:
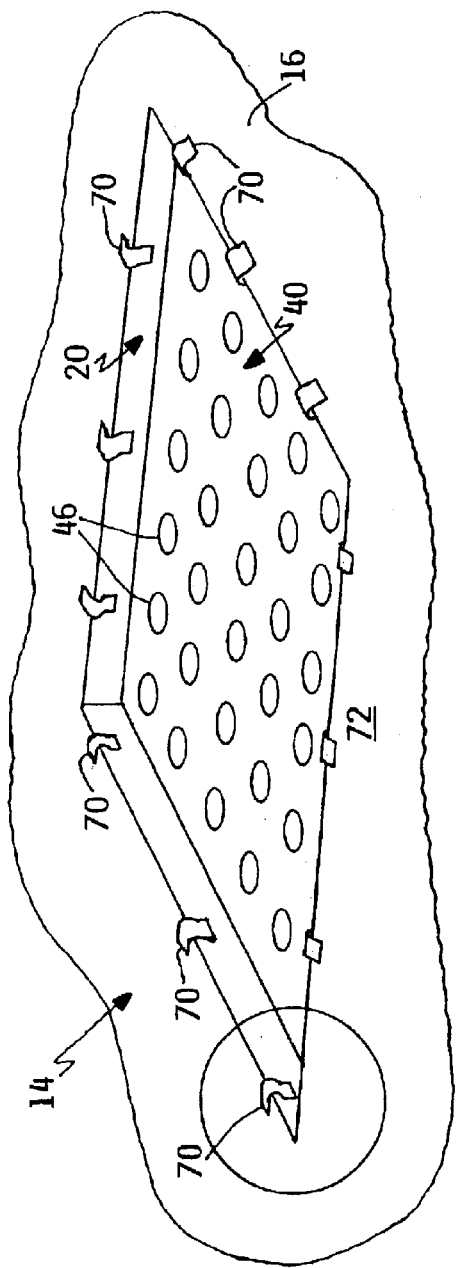
FIG. 4 is an enlarged perspective view of a module made according to the present invention with the coupling mechanism associated therewith.
Figure 5:
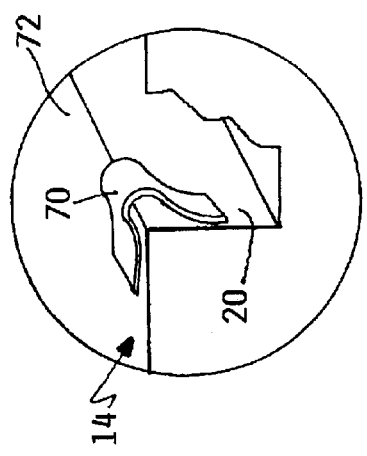
FIG. 5 is an enlarged fragmented view of one of the connection mechanisms of the present invention.

Reference is made to FIG. 4, which illustrates one preferred embodiment of an electrical coupling arrangement 40 for electrically coupling the component assembly to semi-conductor chip assembly. While this embodiment is being shown, it will be understood that a wide variety of electrical coupling systems are contemplated, such as detachable, non-permanent, snap or quick-action, sliding, mating, electromagnetic, etc. It is to be understood that the term coupling arrangement includes all technical equivalents operating in a similar manner to accomplish a similar purpose. In this embodiment, electrical conductors 42 (FIG. 1) extend from one of the active components 28 and electrically connected to lead frames 44 on a bottom surface of the component board 30. The lead frames 44 are electrically coupled to plurality of electrical contacts 46, such as fuzz button contacts 46 housed in an electrically insulative member 48 (FIG. 3). While fuzz button contacts 46 are described, the invention contemplates other kinds of contacts, such as SMT pads or the like. It will be understood that the invention contemplates other kinds of conductive networks. The conductors and conductive networks envisioned may be bare or encased, may be single strand or plural strands or the like and have the property of conducting electricity. The insulative member 48 is comprised of a relatively thin planar dielectric board having electrical conductors 50 that extend from the bottom of each of the fuzz button contacts 46 to the lateral edges of the member 48. The electrical conductors 50 can extend through vias to individual contact points 52 on the top of the insulative member 48. Thereafter, conducting wires 54, such as A-1 wires are wire bonded so as to be electrically connected from the contact points 52 to either the semiconductor die attach 56 and/or to at least individual metallic balls 58 of a ball grid array. Alternatively, the insulative member 48 can be made of other known or yet to be developed equivalent constructions for electrically connecting the component board 30 to a semiconductor die or chip 60 mounted on the die attach 56 which in turn is mounted on a dielectric substrate 59. A dielectric mounting pedestal 64 is joined to and between the insulative member and the dielectric mounting member. For instance, a known type of flexible conductive tape member such as a TAB tape member (not shown) can be used as the insulative member. It will be appreciated that the inductance through the conductors 44 is less than would be in the case of a conventional header and board conductor layout. Furthermore, in the exemplary embodiment the kinds of semiconductor chip assemblies can vary in regard to type and number as well as the materials of the dielectric substrate, dielectric member and the die attach. In addition, the fuzz buttons can be directly connected to the die attach through the pedestal. It will be understood that the foregoing construction enables significant reductions in EMI as well as maximizes available board space or conversely enhances compactness by reducing the board size that would be necessary without the present construction. The foregoing arrangement enhances electrical signal integrity as well. The present invention also contemplates optical coupling if the components 28 are to be receptive to the transmission of portions of the electromagnetic spectrum, such as laser beams used in optical transmission.

Reference is made back to the releasable coupling assembly 26 for use in releasably and positively retaining the functional component assembly 12 in the socket. In the exemplary embodiment of FIGS. 4 and 5, the releasable coupling assembly 26 includes a plurality of deformable spring-biased retention clips 70 having the configuration and size as is depicted that are secured in spaced apart relationship to the housing assembly about the marginal edges 72 of the socket. The retention clips 70 provide for the positive yet, preferably, releasable retention of the functional component assembly in a quick-disconnect fashion. Of course, the retention clips are deformed and displaceable for allowing insertion and removal of the functional component assembly 12 either manually or with tools. It will be further appreciated that the spring clips can be placed on all or part of the component assembly. While a plurality of resilient spring clips is described, it is within the spirit and scope to use other known non-permanent and releasable retention systems, such as latching members or sliding members wherein releasable retention of the component assembly is attained. Also, the present invention envisions yet to be invented equivalent releasable or non-permanent coupling systems. Essentially, coupling systems and non-permanent arrangements can be used such as electromagnetic as well as others that perform the functioning described herein. Also, the invention is not intended to be limited to the specific terms selected. It is to be understood that each specific term includes all technical equivalents that operate in a similar manner to accomplish a similar purpose.

Figure 6:
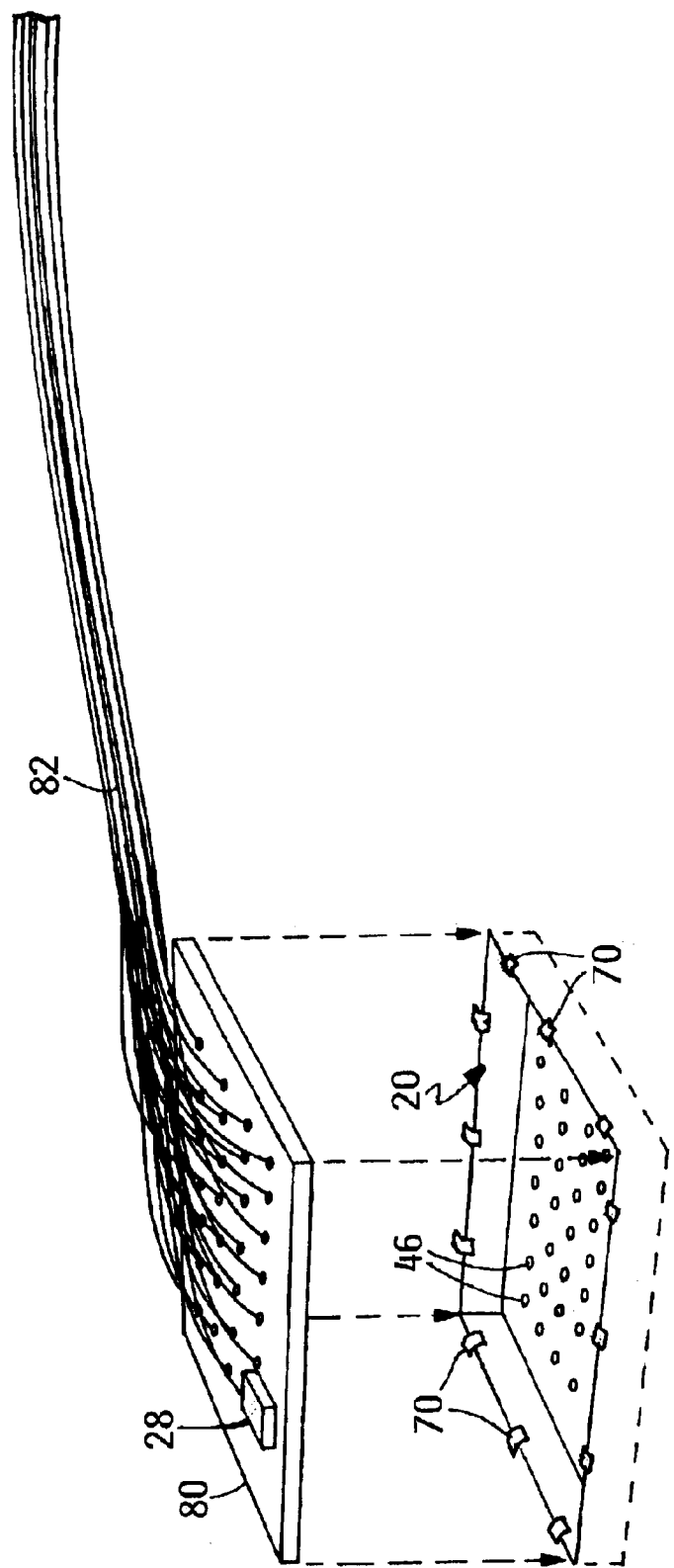
FIG. 6 is a perspective view of another preferred embodiment of the present invention.

FIG. 6 illustrates a preferred embodiment wherein a connector 80 of, for example, a power or test connector type can be inserted within the socket for electrical coupling to the semiconductor chip (not shown) through contact with the fuzz button contacts or the like. The connector 80 has a thin planar and rectangular or other shape and can be appropriately connected to electrical conductors 82. The connector 80 is intended to be permanently affixed or releasably connected. Whether the connector 80 is of a power supply or a testing type, the methods of attachments of it provide several significant advantages. From the standpoint of the testing device, a user can easily test functionalities of each chip in the field as well. This is in contrast to the current approach for BGA testing on the bottom side only. Also, if connector 80 delivers power to the chip through the contacts, higher current densities could be delivered without using I/O pins for power with a decoupling capacitor type component 28 on connector 80. Coax and other cables could be used for the connectors.

Figure 8:
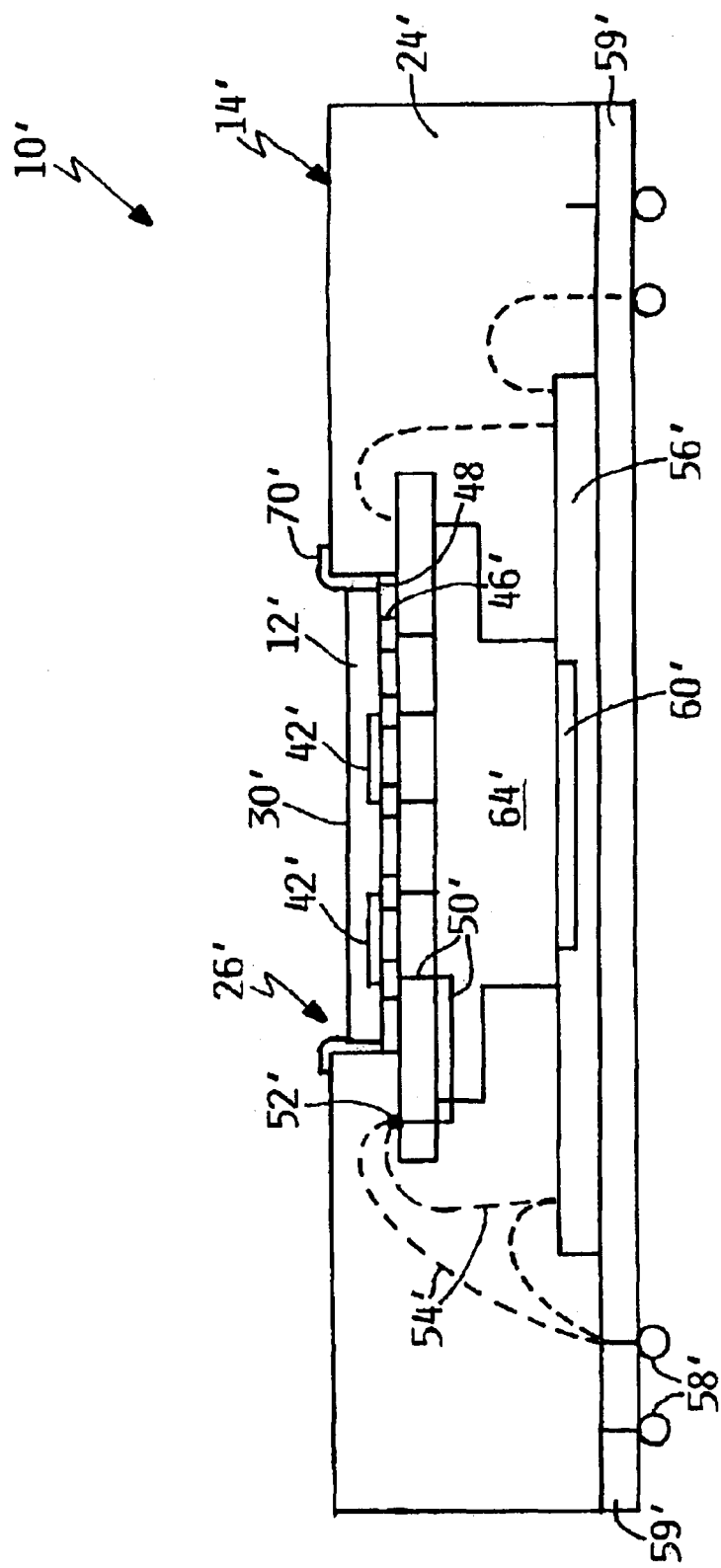
FIG. 8 is a perspective view similar to FIG. 4, but illustrating another preferred embodiment of a packaging arrangement of the present invention.

FIG. 8 illustrates another embodiment of the present invention, wherein the structure that is similar to FIG. 4 will be indicated by the same reference numerals with, however, the addition of a prime marking. The functional component assembly 12' can be an active semiconductor device, such as a semiconductor assembly, such as a chip assembly, a semiconductor memory device, an organic semiconductor device, or the like. A semiconductor assembly may or may not include other significant circuits. For example, the component assembly 12' may be included in a VLSI arrangement, for facilitating higher speeds between the functional components and the semiconductor chip 60 without significant disadvantages of EMI; while providing advantages for SI and other functions.

From the foregoing description, several advantages clearly flow from this invention. Advantages include providing the ability to quickly allow customization or modification of chip modules, by which the operational functionalities of chip modules in the field can be enhanced by modification through adjusting parameters thereof in ways known. Because of the foregoing preferred embodiments, numerous advantages are derived including a method and apparatus for the minimization of electromagnetic interference (EMI) that arise from relatively large area within the boundaries of the lead frame and the chip.

Yet other advantages include the significant improvement in the reduction of functional component space on board's for semiconductor devices. Yet another advantage of the present invention is the significant improvement in speed of such semiconductor devices because of decreased distances the lead frames and conductors have, the smaller area existing between a chip and the lead frames and the reduction of inductance. Yet another advantage of the present invention is the significant improvement in system versatility in allowing quick connects and disconnects of components. An advantage of the present invention is to provide for maximum board space savings. Yet another advantage of the present invention is the significant improvement in the reduction of space in semiconductor devices.

Other advantages include method and package for the minimization of electromagnetic interference EMI caused by lead frames as well as significant enhancement of electromagnetic compatibility EMC of components on a circuit component assembly. Significantly, such method and package provide for maximum board space savings as well as cost effective manufacturing. The method and package make provision for a product packaging that allows the formation of a wide variety of product offerings. Clearly, other advantages include allowing personal and portable electronic devices to be made more compact and less costly to produce. A still further advantage of the present invention is provision for applications that are board size-sensitive such as cellular phones, digital cameras, and computer systems that will benefit from the small size of these packages. An advantage of the present invention is the significant improvement in the efficiency of operation of the components of the printed circuit boards by placement in the, preferably, overlying juxtaposed arrangement shown and described. Another advantage of the present invention is the significant improvement in the efficiency of space given form-factor constraints for various products. Significantly, the present invention provides for benefits associated with the smallest form-factor packages available.

The embodiments and examples set forth herein were presented to best explain the present invention and its practical applications and to thereby enable those skilled in the art to make and use the invention. However, those skilled in the art will recognize that the foregoing description and examples have been presented for the purposes of illustration and example only. The description set forth is not intended to be exhaustive or to limit the invention to the precise forms disclosed. In describing the above preferred embodiments illustrated in the drawings, specific terminology has been used for the sake of clarity. However, the invention is not intended to be limited to the specific terms selected. It is to be understood that each specific term includes all technical equivalents that operate in a similar manner to accomplish similar purposes and yet to be developed equivalents. Many modifications and variations are possible in light of the above teachings without departing from the spirit and scope of the appended claims.

What is claimed is:

1. A packaging apparatus comprising:
   a chip module including a housing assembly and a chip assembly within the housing assembly; the housing assembly including at least one socket to receive at least one functional component assembly therein;
   at least one functional component assembly to be removably received within the socket and coupled to the chip assembly in an overlying juxtaposed relationship; the functional component assembly comprising:
      a printed circuit board sized and shaped to closely fit within the socket; and,
      a plurality of functional components mounted on a first surface of the printed circuit board and which are electrically coupled to the chip assembly; and,
   a coupling apparatus for releasably mechanically coupling the printed circuit board within the socket and electrically to the chip module.

2. The packaging apparatus of claim 1, wherein the one functional component includes electrical conductors extending therefrom and electrically connected to lead frames on a second surface of the printed circuit board that is received within the socket.

3. The packaging apparatus of claim 2, wherein the chip module includes an insulative member including a plurality of electrical contacts housed therein, the lead frames of the printed circuit board are electrically coupled to the plurality of electrical contacts of the insulative member.

4. The packaging apparatus of claim 3, wherein the insulative member is comprised of a relatively thin planar dielectric board, and a plurality of electrical conductors on the dielectric board extend from the bottom of each of the electrical contacts of the insulative member to lateral edges of the insulative member, the electrical conductors extend to individual contact points on the top of the insulative member; and, a plurality of conducting wires are wire bonded so as to be electrically connected from the contact points to a semiconductor die attach and/or to at least individual elements of a ball grid array.

5. The packaging apparatus of claim 3, wherein the electrical contacts include fuzz buttons.

6. The packaging apparatus of claim 1, wherein the releasably mechanical coupling apparatus includes one or more quick-disconnect coupling elements, wherein the coupling elements are made of a resiliently deformable connector positioned adjacent edges of at least one of the one functional component that is received within the socket of the housing assembly.

7. The packaging apparatus of claim 1 wherein the one functional component is selected from a group consisting at least one active component, passive component, semiconductor assembly, semiconductor chip, semiconductor memory device, connector, and bus.

* * * * *